(12) United States Patent
Gelderloos et al.

(10) Patent No.: US 6,243,243 B1
(45) Date of Patent: Jun. 5, 2001

(54) SOLAR ARRAY WITH ESD PROTECTION

(75) Inventors: Carl J. Gelderloos, Redondo Beach; Phillip L. Leung, La Canada, both of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/267,534

(22) Filed: Mar. 12, 1999

(51) Int. Cl.[7] ..................................................... H02H 9/00
(52) U.S. Cl. ................ 361/56; 361/18; 361/111; 361/118
(58) Field of Search ................................ 361/118, 18, 56, 361/111, 115

(56) References Cited

U.S. PATENT DOCUMENTS 4,691,159 * 9/1987 Ahrens et al. ........................ 323/222
5,594,313 * 1/1997 Takeda ..................................... 320/1

* cited by examiner

*Primary Examiner*—Stephen W. Jackson
(74) *Attorney, Agent, or Firm*—T. Gudmestad

(57) ABSTRACT

A solar array having protection from electrostatic discharge (ESD) has a load coupled to the array. The load has a ground terminal that is also coupled to the solar array. A high impedance device is coupled between the array and ground terminal to prevent any stray currents due to ESD from entering the ground terminal.

9 Claims, 1 Drawing Sheet

SOLAR ARRAY WITH ESD PROTECTION

TECHNICAL FIELD

The present invention relates to solar panels, and more particularly, to a circuit to protect solar panels from electrostatic discharge (ESD) particularly for use with a satellite.

BACKGROUND ART

Solar arrays are used to power satellites in space. The solar arrays are used to power the spacecraft payload as well as charge batteries onboard the satellite. Recently, on-orbit solar array power losses have been observed. These power losses have been attributed to electrostatic discharge (ESD) induced arcing. It has been found that the ESD induced arcing is enhanced by the power available from the solar array circuit. On most satellites, there is a high ratio of insulating to conductive materials that are exposed to sunlight. During a geomagnetic storm, electrical potentials on the spacecraft can reach several kilovolts.

Solar arrays have cover glass that protects the individual solar cells beneath it. The cover glass is isolated from the spacecraft structure because of its high resistivity. The isolation allows the glass to charge less negative due to photo emission. The result is a net positive voltage differential between the cover glass and solar array substrate over time. At differential voltages of between 500 and 1500 volts, ESD may occur. The ESD manifests itself in plasma that spreads out over adjacent cover glasses. The positively charged cover glass absorbs negative charge from the neutral plasma and induces a transient displacement current in the solar cell circuits below. The displacement current can flow to spacecraft ground, which is electrically at the opposite end of the solar cell circuit.

If sufficient plasma is generated at the original ESD site, and there are solar cells with large potential differences between them nearby, the plasma can generate a low impedance path for current from the solar cell circuit to flow. If the current flow through the plasma persists, it can pyrolize the solar array substrate and permanently short the circuit. This may result in permanent power loss for the spacecraft.

SUMMARY OF THE INVENTION

It is, therefore, one object of the invention to provide a solar cell array circuit that prevents power loss due to electrostatic discharge.

In one aspect of the invention, a satellite system has a spacecraft payload and a solar array having a plurality of solar panels electrically coupled to the payload. The spacecraft ground terminal and the solar array are coupled together through a directional high impedance device that only increases the impedance to ground for the displacement current but keeps the impedance low for the usual low current, thereby reducing the potential for a sustained discharge.

One advantage of the invention is that this circuit may be used in place of, or in addition to, other electrical protections used on a spacecraft.

Other objects and features of the present invention will become apparent when viewed in light of the detailed description of the preferred embodiment when taken in conjunction with the attached drawings and appended claims.

BEST MODE(S) FOR CARRYING OUT THE INVENTION

While the present invention is described with respect to a satellite application, one skilled in the art would recognize that applications for the solar cell circuit outside the satellite field exist.

Figure 1:
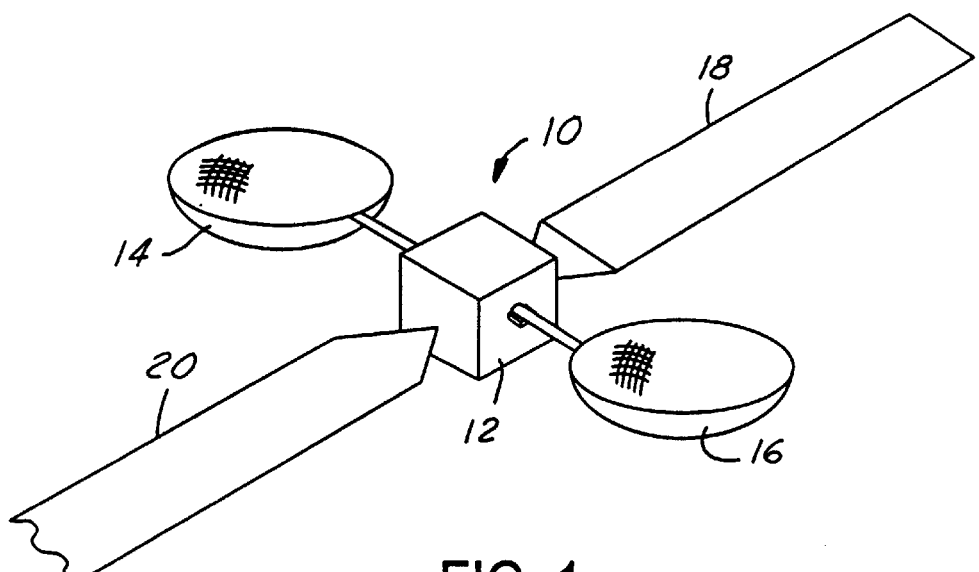
FIG. 1 is a view of a satellite in the deployed configuration in which the present invention is applicable.

Referring to FIG. 1, a schematic representation of a satellite is illustrated with the satellite in a fully deployed position. Satellite 10 has a housing 12 and a pair of antennas 14, 16 that are connected to and extend outwardly from the housing 12. Housing 12 also has a pair of solar panels 18, 20 that extend outwardly from the housing 12.

Figure 2:
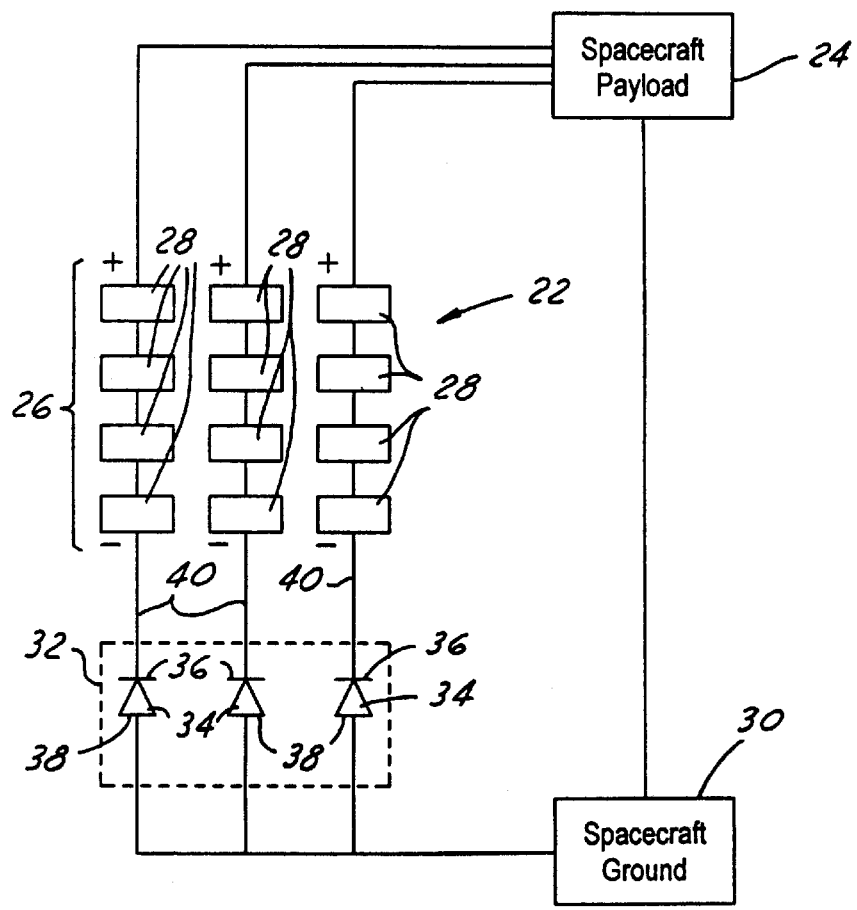
FIG. 2 is a schematic view of a satellite circuit having electrostatic discharge protection according to the present invention.

Referring now to FIG. 2, the satellite shown above has an electrical circuit 22 that is used to operate the satellite. Electrical circuit 22 has a spacecraft payload 24. Spacecraft payload 24 performs such satellite functions as tracking, control, and command of the satellite. The spacecraft payload may include a battery (not shown) that is used to power payload 24. Spacecraft payload is coupled to an array 26 of solar cells 28. Solar cells 28 convert solar energy into electrical energy for powering payload 24. Solar cells 28 also charge a battery included in payload 24 so that the battery may be used during periods of little or no solar energy.

Solar array 26 is coupled to a spacecraft ground terminal 30. Spacecraft ground terminal 30 may also act as the ground for spacecraft payload 24. Spacecraft ground 30 is the electrical reference for the circuits onboard the satellite.

A high impedance device 32 is coupled between array 26 and spacecraft ground terminal 30. High impedance device 32 prevents any potential differences on the spacecraft from completing an electrical path into spacecraft ground terminal 30.

High impedance device 32 may be comprised of various electrical components such as diodes 34. Diodes 34 have a cathode terminal 36 and an anode terminal 38. Cathode terminal 36 is preferably coupled to a negative potential end 40 of solar cells 28. Anode 38 is coupled to spacecraft ground terminal 30.

In operation, as plasma of electrical potential forms on the exterior of spacecraft, high impedance device 32 prevents an electrostatic discharge from occurring between solar array 26 and spacecraft ground 30. High impedance device 32 increases the usually low impedance connection between the negative potential end of the solar cells 28 and the spacecraft ground 30.

While particular embodiments of the invention have been shown and described, numerous variations and alternate embodiments will occur to those skilled in the art. Accordingly, it is intended that the invention be limited only in terms of the appended claims.

What is claimed is:

1. A circuit for use with solar panels comprising:
   an electrical load;
   a solar panel coupled to said load;
   a ground terminal coupled to said solar panel; and
   a high impedance device electrically coupled between said ground terminal and said solar panel.

2. A circuit as recited in claim 1 wherein said high impedance device comprises a diode.

3. A circuit as recited in claim 1 further comprising a plurality of diodes, each of said diodes electrically coupled between said ground and said solar panel.

4. A circuit as recited in claim 1 where in s aid diode has an anode terminal and a cathode terminal, said cathode terminal coupled to said solar panel and said anode terminal coupled to said ground terminal.

5. A satellite comprising:

a payload;

a solar array having a plurality of solar panels electrically coupled to said payload;

a spacecraft ground terminal coupled to the solar array; and a high impedance device electrically coupled between said panels and said ground terminal.

6. A satellite as recited in claim 5 wherein said high impedance device comprises a diode.

7. A satellite as recited in claim 5 further comprising a plurality of diodes, each of said diodes electrically coupled between said ground and said solar array.

8. A satellite as recited in claim 5 wherein said diode has an anode terminal and a cathode terminal, said cathode terminal coupled to said solar array and said anode terminal coupled to said ground terminal.

9. A method of preventing electrostatic discharge comprising the steps of:

electrically coupling a load to a solar pane;

electrically coupling a high impedance device between a solar array and a ground terminal; and impeding an electrostatic discharge between the solar panel and a ground terminal.

* * * * *